United States Patent
Stauss et al.

(10) Patent No.: US 8,410,507 B2
(45) Date of Patent: Apr. 2, 2013

(54) THERMAL LIGHT SOURCE HAVING A HIGH COLOR RENDERING QUALITY

(75) Inventors: Peter Stauss, Pettendorf (DE); Reiner Windisch, Pettendorf (DE); Frank Baumann, Regensburg (DE); Matthias Peter, Alteglofsheim (DE)

(73) Assignee: OSRAM Opto SEmiconductors GmbH, Regensburg (DE)

( * ) Notice: Subject to any disclaimer, the term of this patent is extended or adjusted under 35 U.S.C. 154(b) by 0 days.

(21) Appl. No.: 13/122,779

(22) PCT Filed: Aug. 11, 2009

(86) PCT No.: PCT/DE2009/001140
§ 371 (c)(1),
(2), (4) Date: Jun. 28, 2011

(87) PCT Pub. No.: WO2010/040327
PCT Pub. Date: Apr. 15, 2010

(65) Prior Publication Data
US 2011/0248295 A1    Oct. 13, 2011

(30) Foreign Application Priority Data
Oct. 7, 2008  (DE) .......................... 10 2008 050 643

(51) Int. Cl.
*H01L 29/22*    (2006.01)
*H01L 29/227*   (2006.01)
*H01L 33/00*    (2010.01)

(52) U.S. Cl. ............... 257/98; 257/99; 257/E33.056; 257/E33.057; 257/E33.058; 257/E33.069; 257/E33.073

(58) Field of Classification Search ........... 257/98, 257/99, E33.056, E33.057, E33.058, E33.069, 257/E33.073
See application file for complete search history.

(56) References Cited

U.S. PATENT DOCUMENTS

| | | | |
|---|---|---|---|
| 6,809,342 B2 * | 10/2004 | Harada | 257/79 |
| 7,023,019 B2 * | 4/2006 | Maeda et al. | 257/89 |
| 7,078,732 B1 * | 7/2006 | Reeh et al. | 257/98 |
| 7,268,370 B2 * | 9/2007 | Ueda | 257/84 |
| 7,318,651 B2 * | 1/2008 | Chua et al. | 362/11 |
| 7,404,652 B2 * | 7/2008 | Ng et al. | 362/231 |
| 7,427,784 B2 * | 9/2008 | Liu et al. | 257/99 |

(Continued)

FOREIGN PATENT DOCUMENTS

| | | |
|---|---|---|
| CN | 101138104 | 3/2008 |
| CN | 101253637 | 8/2008 |

(Continued)

*Primary Examiner* — Ida M Soward
(74) *Attorney, Agent, or Firm* — Cozen O'Connor

(57) ABSTRACT

A luminous means (1) including at least one optoelectronic semiconductor device (2) which emits electromagnetic radiation during operation at at least one first wavelength (L1) and at at least one second wavelength (L2), wherein the first wavelength (L1) and the second wavelength (L2) differ from one another and are below 500 nm, in particular between 200 nm and 500 nm. Furthermore, the luminous means (1) includes at least one conversion means (3) which converts the first wavelength (L1) at least partly into radiation having a different frequency. The radiation spectrum emitted by the luminous means (1) during operation is metameric with respect to a black body spectrum. Such a luminous means makes it possible to choose the first wavelength and the second wavelength in such a way that a high color rendering quality and a high efficiency of the luminous means can be realized simultaneously.

16 Claims, 6 Drawing Sheets

U.S. PATENT DOCUMENTS

| | | | |
|---|---|---|---|
| 7,737,621 B2 * | 6/2010 | Masuda et al. | 313/501 |
| 7,821,023 B2 * | 10/2010 | Yuan et al. | 257/98 |
| 7,838,876 B2 * | 11/2010 | von Malm | 257/43 |
| 7,850,321 B2 * | 12/2010 | Wang et al. | 362/84 |
| 7,859,006 B2 * | 12/2010 | Kato et al. | 257/100 |
| 7,982,233 B2 * | 7/2011 | Berben et al. | 257/98 |
| 8,035,287 B2 * | 10/2011 | Schmidt et al. | 313/487 |
| 8,119,028 B2 * | 2/2012 | Le Toquin | 252/301.4 F |
| 8,125,137 B2 * | 2/2012 | Medendorp et al. | 313/501 |
| 8,188,502 B2 * | 5/2012 | Li | 257/98 |
| 8,256,914 B2 * | 9/2012 | Bechtel et al. | 362/84 |
| 2004/0217364 A1 | 11/2004 | Tarsa et al. | |
| 2005/0117334 A1 | 6/2005 | Lee et al. | |
| 2005/0161690 A1 | 7/2005 | Lai et al. | |
| 2005/0266588 A1 | 12/2005 | Stauss | |
| 2006/0081862 A1 | 4/2006 | Chua et al. | |
| 2006/0081871 A1 | 4/2006 | Streubel | |
| 2006/0243987 A1 | 11/2006 | Lai | |
| 2007/0221925 A1 | 9/2007 | Aliyev et al. | |
| 2007/0223219 A1 | 9/2007 | Medendorp et al. | |
| 2007/0258240 A1 * | 11/2007 | Ducharme et al. | 362/231 |
| 2008/0265268 A1 * | 10/2008 | Braune et al. | 257/98 |
| 2009/0001390 A1 * | 1/2009 | Yan et al. | 257/89 |
| 2009/0026913 A1 * | 1/2009 | Mrakovich | 313/498 |
| 2009/0117672 A1 * | 5/2009 | Caruso et al. | 438/7 |
| 2009/0212316 A1 * | 8/2009 | Braune et al. | 257/99 |
| 2010/0207098 A1 | 8/2010 | Avramescu et al. | |
| 2010/0295073 A1 * | 11/2010 | Grotsch et al. | 257/98 |

FOREIGN PATENT DOCUMENTS

| | | |
|---|---|---|
| DE | 10 2004 052 245 | 2/2006 |
| DE | 10 2004 047 763 | 4/2006 |
| DE | 10 2005 045 106 | 6/2006 |
| DE | 10 2007 058 723 | 3/2009 |
| EP | 1 160 883 | 12/2001 |
| TW | 200525779 | 8/2005 |
| WO | WO 2006/105649 | 10/2006 |
| WO | WO 2007/025515 | 3/2007 |
| WO | WO 2007/140738 | 12/2007 |

* cited by examiner

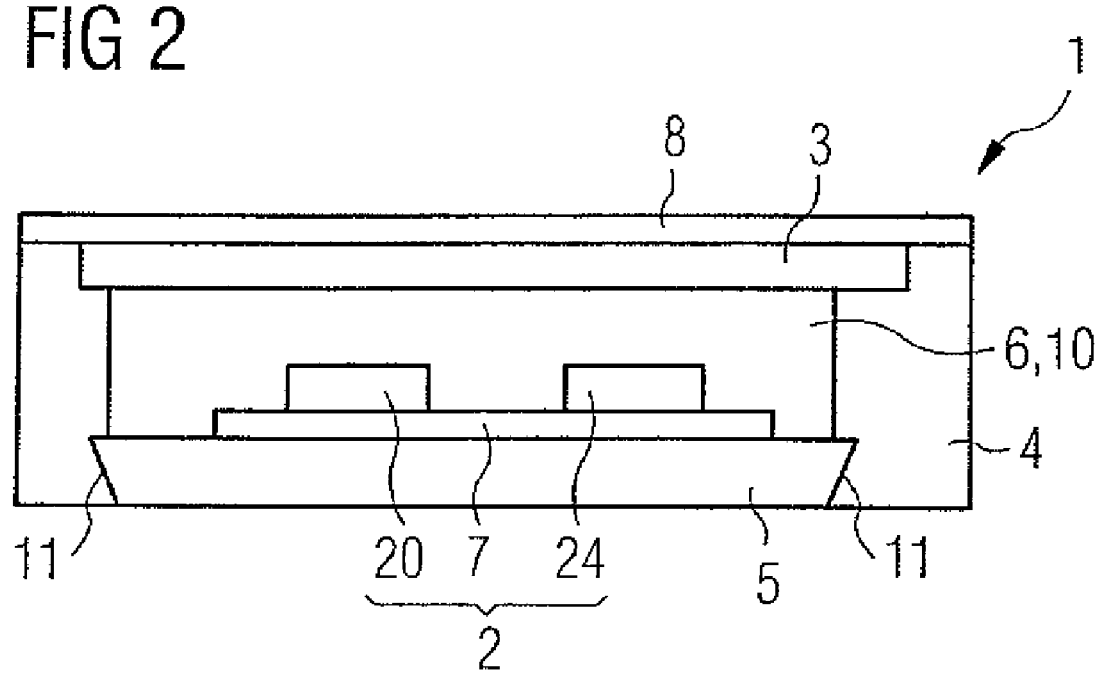

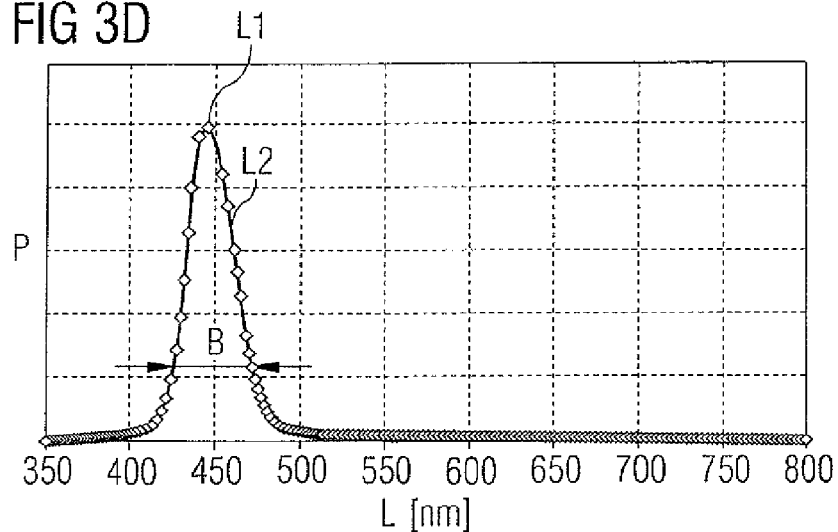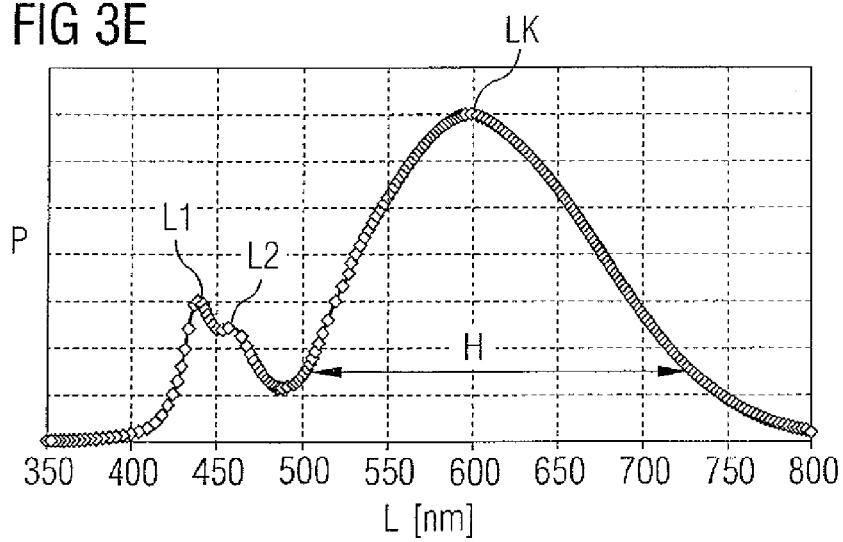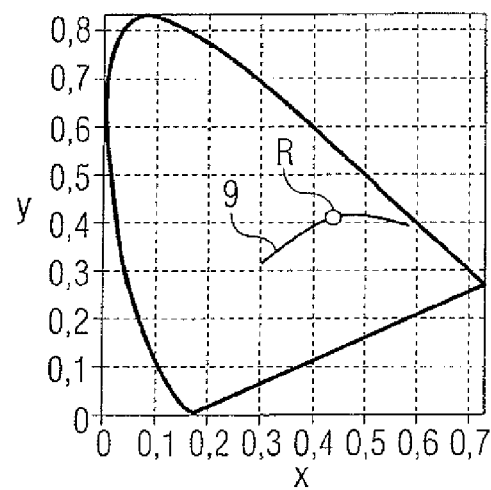

THERMAL LIGHT SOURCE HAVING A HIGH COLOR RENDERING QUALITY

RELATED APPLICATIONS

This is a U.S. national stage of application No. PCT/DE2009/001140, filed on Aug. 11, 2009.

This application claims the priority of German application Ser. No. 10 2008 050 643.5 filed Oct. 7, 2008, the entire content of which is hereby incorporated by reference.

FIELD OF THE INVENTION

The present invention is related to a luminous means having an optoelectronic semiconductor device.

By comparison with thermal light sources or luminous means such as incandescent lamps, for example, "cold" light sources such as light-emitting diodes, luminescent diodes or laser diodes are distinguished by a high efficiency, a high lifetime and a compact design. However, an equally important aspect is also the spectrum of the light emitted by a luminous means. Thermal light sources emit a wide, almost continuous spectrum of electromagnetic radiation in the visible spectral range, similar to the spectrum of a black body. Light-emitting diodes, for example, emit in comparatively narrow spectral ranges in the visible spectral range.

SUMMARY OF THE INVENTION

One object of the present invention is to provide a luminous means having a high color rendering quality.

In accordance with at least one embodiment of the luminous means, the latter comprises at least one optoelectronic semiconductor device. The semiconductor device can be configured as light-emitting diode or as laser diode. The semiconductor device emits during operation electromagnetic radiation lying at least partly in the spectral range of between 340 nm and 780 nm.

In accordance with at least one embodiment of the luminous means, the optoelectronic semiconductor device emits during operation at at least one first wavelength. In this case, wavelength is understood to mean a spectral range or a wavelength range which corresponds to an emission band of a semiconductor chip, for instance. Such emission bands are narrowband and have spectral widths of the order of magnitude of 20 nm. "Width" relates to the full width at half maximum, FWHM for short. Wavelength should be understood to mean the spectral position of the maximum of the emission band or of the wavelength range. Hereinafter, "wavelength" includes the spectral range of the emission band or the corresponding wavelength range.

In accordance with at least one embodiment of the luminous means, the first wavelength is below 500 nm, in particular between 300 nm and 500 nm, preferably between 400 nm and 450 nm, particularly preferably between 410 nm and 440 nm. In other words, the first wavelength is in the near ultraviolet or blue spectral range.

In accordance with at least one embodiment of the luminous means, the latter emits light at a second wavelength, in particular in the spectral range of between 200 nm and 500 nm, preferably in the spectral range of between 430 nm and 490 nm. The first wavelength has, in particular, higher frequencies than the second wavelength.

In accordance with at least one embodiment of the luminous means, the latter emits electromagnetic radiation at at least one first and one second wavelength, wherein first wavelength and second wavelength differ from one another. The emission bands with respect to first and second wavelengths can partly overlap.

First wavelength and second wavelength respectively relate to the spectral signature of the radiation directly emitted by the semiconductor device. In particular, this radiation is not influenced by a conversion means or an absorber.

In accordance with at least one embodiment of the luminous means, the latter comprises a conversion means. The conversion means is configured for converting at least radiation having the first wavelength at least partly into radiation having a different frequency. In particular, the wavelength of the converted radiation is greater than the first wavelength. In other words, the converted radiation comprises frequencies that are lower than the frequencies in the spectral range of the first wavelength.

In accordance with at least one embodiment of the luminous means, the radiation spectrum emitted during operation of the luminous means is metameric with respect to a black body spectrum. If different spectra are metameric with respect to one another, then this means that the spectra have the same chromaticity coordinate. This means for the luminous means, therefore, that the radiation spectrum has a composition or a profile such that the sensory impression of said radiation spectrum as perceived by the human eye corresponds to that of a black body spectrum. In other words, the luminous means therefore forms for the human eye an emitter in the form of an ideal black body in thermal equilibrium. The luminous means is preferably configured such that the radiation emitted during operation is perceived as white light, in particular as warm-white light.

Metameric with respect to a black body spectrum also means that the average distance between the chromaticity coordinate of the radiation emitted by the luminous means and the black body curve in the standard chromaticity diagram is less than or equal to 0.07, within the scope of production and measurement accuracy. Preferably, the distance is less than or equal to 0.05, in particular less than or equal to 0.025. In this case, the distance is defined as the root of the sum of the square of the x deviation and of the y deviation.

According to at least one embodiment of the luminous means, the latter comprises at least one optoelectronic semiconductor device which emits electromagnetic radiation during operation at at least one first wavelength and at least one second wavelength, wherein first wavelength and second wavelength differ from one another and are below 500 nm, in particular between 300 nm and 500 nm. Furthermore, the luminous means comprises at least one conversion means which converts the first wavelength at least partly into radiation having a different frequency. The radiation spectrum emitted by the luminous means during operation is metameric with respect to a black body spectrum.

Such a luminous means makes it possible to choose the first wavelength and the second wavelength in such a way that a high color rendering quality and a high efficiency of the luminous means can be realized simultaneously.

In accordance with at least one embodiment of the luminous means, the semiconductor device has at least one semiconductor chip which emits at the first wavelength during operation and at least one semiconductor chip which emits at the second wavelength. The ratio between the radiation power at the first wavelength and at the second wavelength can be set in a targeted manner for example by means of different energizations of the two semiconductor chips. It is possible for the at least two semiconductor chips to be operated and/or driven independently of one another.

In accordance with at least one embodiment of the luminous means, the semiconductor component comprises at least one semiconductor chip which emits both radiation having the first wavelength and radiation having the second wavelength during operation. In other words, a single semiconductor chip can suffice to generate the first wavelength and also the second wavelength. Such a semiconductor chip is specified in the document US 2005/0266588 A1, for example, the disclosure content of which with regard to the semiconductor chip described there and the production method for such a semiconductor chip described there is incorporated by reference. By means of such a semiconductor chip, it is possible to realize a compact semiconductor component and hence a space-saving luminous means.

In accordance with at least one embodiment of the luminous means, the semiconductor device comprises at least one semiconductor chip which has an active zone having at least one first part and having at least one second part. First and second parts are arranged vertically, that is to say perpendicularly to a main extension direction of the active zone, preferably one above another. In particular, no tunnel contact is situated between the first part and the second part. During operation, radiation having the first wavelength is generated in the first part of the active zone, and radiation having the second wavelength is generated in the second part of the active zone. By way of example, differently configured quantum wells are situated in the two parts of the active zone, said quantum wells emitting light at different wavelengths during operation. A semiconductor chip of this type is specified in the document WO 2007/140738 A1, the disclosure content of which with regard to the semiconductor chip described there is incorporated by reference. A semiconductor device comprising such a semiconductor chip is constructed in a compact fashion. The luminous means has a high efficiency as a result of such a semiconductor device.

In accordance with at least one embodiment of the luminous means, the latter comprises a semiconductor device comprising at least one semiconductor chip having an active zone which emits radiation having the first wavelength during operation. As seen in a main emission direction, a luminescence structure is disposed downstream of the active zone, said luminescence structure absorbing part of the first wavelength and reemitting it at the second wavelength. Active zone and luminescence structure are preferably based on the same semiconductor material on which, in particular, the entire semiconductor device is also based. By way of example, active zone and luminescence structure are based on the InGaN or GaN material system. A semiconductor chip of this type is specified in the document DE 10 2004 052 245 A1, the disclosure content of which with regard to the semiconductor chip described there is incorporated by reference. A compact, efficient arrangement for a luminous means can be obtained by virtue of the use of such semiconductor chips.

In accordance with at least one embodiment of the luminous means, a conversion means is disposed downstream of the entire semiconductor device. That means that the radiation of all the semiconductor chips passes through, at least in part, the conversion means. In particular, substantially the entire radiation emitted by the semiconductor device passes through the conversion means. "Substantially" can mean that more than 80%, preferably more than 95%, of the radiation emitted by the semiconductor device passes through the conversion means. Such a luminous means is constructed in a simple and compact manner and has a high conversion efficiency.

In accordance with at least one embodiment of the luminous means, first and second wavelengths are spectrally separated from one another by at least 10 nm. Preferably, the spectral distance is at least 15 nm, in particular at least 20 nm. A large spectral distance between first wavelength and second wavelength makes it possible, for example, to set the absorption of one of the wavelengths by a medium, in particular by the conversion means, in a targeted manner.

In accordance with at least one embodiment of the luminous means, a spectral width of the radiation emitted by the semiconductor device is at least 50 nm. Preferably, the spectral width is at least 65 nm. In this case, the spectral width is defined such that it is a continuous spectral range. The limits of this range of the spectral width are defined by the fact that the radiation intensity at the limits has fallen to approximately 13.6% of a maximum value of the intensity within this range. The limit therefore corresponds to the maximum intensity divided by $e^2$, where e represents the Euler number, and e is approximately 2.71. "Continuous" means that the intensity within the range of the spectral width does not fall below the value of the limits. Intensity should be understood to mean, for example, the spectral intensity density, or else the power density of the radiation. The intensity or power is therefore measured in 1 nm or 2 nm intervals, for example. The intervals should be chosen to be smaller than the spectral width at least by a factor of 20. A large spectral width of the light emitted by the semiconductor device can increase the color rendering quality of the luminous means.

In accordance with at least one embodiment of the luminous means, a color rendering index $R_a$ of the luminous means is at least 80, preferably at least 85, in particular at least 90. The color rendering index, or CRI for short, specifies the magnitude of the average color deviation of defined test color fields in the case of illumination in the case of the light source to be characterized, that is to say the luminous means, in comparison with the illumination with a defined standard light source. The maximum color rendering index is 100 and corresponds to a light source in which no color deviations occur. $R_a$ means that eight test colors, in particular the first eight test colors, are used for determining the CRI. Further indications concerning the measurement and definition of the color rendering index are found in the document DE 10 2004 047 763 A1, the disclosure content of which is hereby incorporated by reference. A color rendering index of at least 80 ensures a high color rendering quality of the luminous means. As an alternative, the color rendering quality can also be specified by means of a different index, for example by means of the color quality scale, CQS for short. The values of a different index should be converted into corresponding CRI values.

In accordance with at least one embodiment of the luminous means, the efficiency thereof is at least 60 lm/W, preferably at least 70 lm/W. This is made possible by the first wavelength, which lies in the spectral range in which the semiconductor device has maximum efficiency. Such a luminous means has, with regard to the conversion of electrical energy into radiation energy, a high efficiency.

In accordance with at least one embodiment of the luminous means, the color temperature thereof lies between 2500 K and 6500 K inclusive, preferably between 2700 K and 4000 K inclusive, in particular between 2900 K and 3400 K inclusive. The color temperature is that temperature of a black body emitter whose chromaticity coordinate is closest to the chromaticity coordinate of the radiation to be characterized, that is to say the radiation of the luminous means. This most similar color temperature is also referred to as correlated color temperature, CCT for short.

In accordance with at least one embodiment of the luminous means, the conversion means converts light having the first wavelength at least to the extent of 50%, in particular at least to the extent of 95%, and light having the second wavelength at most to the extent of 90%, into a radiation having a different wavelength. That is to say that after transmission through the conversion means, at most 5% of the intensity or power of the first wavelength is present in the spectral range of the first wavelength, relative to the intensity or power in this spectral range prior to passage through the conversion means. For the second wavelength, this value is at least 10%. In other words, the first wavelength is converted by the conversion means to a higher extent than the second wavelength.

In accordance with at least one embodiment of the luminous means, the difference in the conversion of first wavelength and second wavelength by the conversion means is at least 5 percent, in particular at least 10 percent, wherein a smaller proportion of the second wavelength is converted. If, in other words, a proportion of X % of the first wavelength is converted into a different wavelength by the conversion means, then the corresponding proportion of the second wavelength is at most (X−5)%, in particular at most (X−10)%.

In accordance with at least one embodiment of the luminous means, the second wavelength is substantially not converted by the conversion means, that is to say that at least 75% of the radiation power at the second wavelength is transmitted by the conversion means. The first wavelength and the second wavelength are therefore coordinated with the absorption of the conversion means such that principally the first wavelength is converted. This allows a high color rendering quality of the luminous means to be ensured by means of the spectral position of the second wavelength.

In accordance with at least one embodiment of the luminous means, the first wavelength is around 430 nm and the second wavelength around 470 nm. That means that the spectral range of the first wavelength comprises 430 nm and the spectral range of the second wavelength comprises 470 nm, in particular in each case plus/minus 10 nm, or the first wavelength and the second wavelength have a maximum intensity in the abovementioned spectral ranges. Preferably, the spectral distance between first wavelength and 430 nm is less than a spectral width, FWHM for short, in particular less than one third of the spectral width, FWHM for short. A corresponding situation likewise preferably applies to the second wavelength. By virtue of a first and a second wavelength chosen in this way, it is possible to realize a high efficiency and a high color rendering quality of the luminous means.

In accordance with at least one embodiment of the luminous means, the semiconductor device comprises at least one semiconductor chip which emits light having a third wavelength of at least 600 nm during operation. The radiation of this semiconductor chip lies, in particular, in the red spectral range, in particular between 600 nm and 780 nm, preferably between 600 nm and 630 nm. The corresponding definition as for the first and a second wavelengths applies to the third wavelength. That is to say that third wavelength denotes the spectral range which corresponds to the corresponding emission band of the semiconductor chip. The third wavelength denotes the maximum of this emission band. The FWHM width of the third wavelength is preferably at least 20 nm, in particular at least 30 nm. The color rendering quality in the long-wave spectral range can be improved by means of the use of a semiconductor chip which emits in the red spectral range.

In accordance with at least one embodiment of the luminous means, the latter comprises a control unit, which can be used to set the intensity ratio between first wavelength and second wavelength. The control unit can be configured in the form of one or a plurality of electrical resistors that determine the energization of, for example, a first semiconductor chip emitting at the first wavelength and a second semiconductor chip emitting at the second wavelength. If the control unit comprises such resistors, then the latter can be fixedly set or else be regulatable. If the resistors are fixedly set, then this is preferably done in the context of the production of the luminous means. If the resistors are variably set or adjustable, for example in the form of a potentiometer, then the color temperature of the luminous means, for example, can be set even during the operation of said luminous means.

In accordance with at least one embodiment of the luminous means, the second wavelength is at a lower wavelength than a main operating range of the conversion means. Main operating range of the conversion means denotes that spectral range in which the most intensive emission band of the conversion means lies. The main operating range is a continuous spectral range. The limits of the main operating range have an intensity which corresponds to approximately 13.6% of the maximum intensity of the main operating range. Within the main operating range, the intensity does not fall below the intensity at the limits. If the second wavelength lies outside the main operating range, then the spectral range of the light emitted by the luminous means is effectively enlarged. This increases the color rendering quality of the luminous means.

In accordance with at least one embodiment of the luminous means, the conversion means contains at least one inorganic cerium- or yttrium-containing solid. The conversion means can be a mixture of a plurality of different substances. The conversion means can be applied in a plurality of layers having a different material composition, including in a structured fashion. A spectrally wide main operating range and a good color rendering quality of the luminous means can be achieved using a conversion means having a plurality of different substances.

In accordance with at least one embodiment of the luminous means, the conversion means contains two inorganic phosphors, in particular exactly two inorganic phosphors. One of the phosphors, phosphor A, emits in the yellow or green spectral range. The other phosphor, phosphor B, emits in the red spectral range. Preferably, a dominant wavelength of the emission of phosphor A lies between 540 nm and 580 nm inclusive, particularly preferably between 550 nm and 575 nm inclusive. The dominant wavelength of the emission of phosphor B is preferably between 590 nm and 615 nm inclusive, particularly preferably between 595 nm and 610 nm inclusive. In this case, the dominant wavelength is, in particular, that wavelength at which the phosphor exhibits maximum emission.

In accordance with at least one embodiment of the luminous means, an absorption maximum of phosphor A lies between 420 nm and 480 nm inclusive, while phosphor B preferably has an absorptance that increases monotonically toward shorter wavelengths. It is not necessary for the absorptance of phosphor B to have a narrowly delimitable optimum or maximum. The emission of phosphor A and the absorption of phosphor B can in this case be coordinated with one another such that reabsorption probability is minimized. In other words, for instance, radiation emitted by phosphor A is not absorbed, or is absorbed only to a negligibly small extent, by phosphor B, and correspondingly vice versa. Furthermore, the absorption maximum of phosphor A and the two wavelengths emitted by the at least one semiconductor chip can be coordinated with one another in such a way as to produce a particularly favorable spectrum with regard to the simultaneous optimization of the parameters of color rendering and efficiency.

In accordance with at least one embodiment of the luminous means, phosphor A is a cerium-doped derivative of the phosphor yttrium aluminum garnet, YAG for short, having the general empirical formula $(Y, Gd, Lu)_3 (Al, Ga)_5 O_{12}:Ce^{3+}$. Phosphor B can be, for example, an Eu-doped nitride having the general empirical formula $(Ca, Sr, Ba) Al Si N_3:Eu^{2+}$ or alternatively $(Ca, Sr, Ba)_2 Si_2 N_5:EU^{2+}$.

By virtue of the fact that the luminous means has a semiconductor device which emits at two different wavelengths, a predefined color rendering quality can already be achieved with fewer different phosphors. In other words, the number of phosphors to be used can be reduced. As a result, it is also possible, on the other hand, to increase the efficiency of the luminous means since a reabsorption of converted radiation can be reduced or avoided. Particularly when a plurality of different phosphors are used, the reabsorption by the different phosphors can reduce the efficiency of the luminous means.

In accordance with at least one embodiment of the luminous means, the first wavelength is around 430 nm and the second wavelength is around 470 nm, with a tolerance of 10 nm in each case. The conversion means converts a proportion of the first wavelength into a radiation having a different wavelength, said proportion being at least 5 percent greater than a corresponding proportion of the second wavelength, wherein the second wavelength is at lower wavelengths than the main operating range of the conversion means.

In accordance with at least one embodiment of the luminous means, both the radiation having the first wavelength and the radiation having the second wavelength pass through the conversion means, wherein the radiation of the first wavelength is converted into a radiation having a different wavelength to the extent of at least 50% and the radiation having the second wavelength is wavelength-converted to the extent of at most 90%.

Some areas of application in which luminous means described here can be used are, for instance, general lighting and backlighting of displays or indicator devices. Furthermore, the luminous means described here can be used, for instance, in illumination devices for projection purposes, in headlights or light emitters.

BRIEF DESCRIPTION OF THE DRAWINGS

A luminous means described here will be explained in greater detail below on the basis of exemplary embodiments with reference to the drawing. In this case, identical reference symbols indicate identical elements in the individual figures. In this case, however, relationships to scale are not illustrated; rather, individual elements may be illustrated with an exaggerated size in order to afford a better understanding.

In the figures:

FIG. 2 shows a schematic sectional illustration of an exemplary embodiment of a luminous means described here.

DETAILED DESCRIPTION OF THE DRAWINGS

Exemplary embodiments of semiconductor devices 2 and semiconductor chips 20 and of a luminous means 1 are illustrated in FIGS. 1 and 2. Spectral properties are elucidated in greater detail in FIGS. 3 and 4.

Figure 1A:
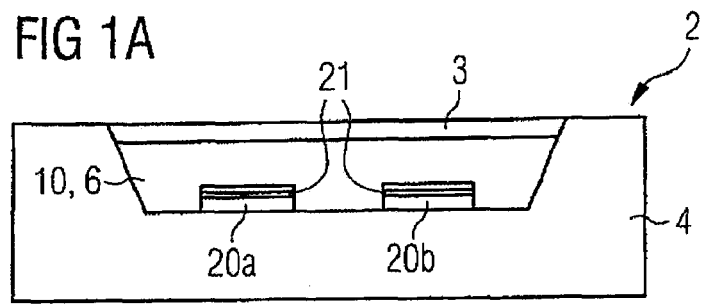
FIG. 1 shows schematic sectional illustrations of exemplary embodiments of semiconductor devices described here.

FIG. 1A illustrates a schematic sectional illustration of an exemplary embodiment of a semiconductor device 2 which can be used in a luminous means 1. A base body 4, which can be produced by means of an injection-molding or die-casting method, for example, has a cutout 10. Two semiconductor chips 20a, 20b are fitted in the cutout 10. The semiconductor chip 20a emits a first radiation having a first wavelength L1, and the semiconductor chip 20b emits a second radiation having a second wavelength L2. A conversion means 3 in the form of a plate or disk is fitted at a side of the cutout 10 which is remote from the semiconductor chips 20a, 20b. A cavity 6 is formed by the base body 4 and the conversion means 3.

The conversion means 3 is spaced apart from the semiconductor chips 20a, 20b. The distance between conversion means 3 and semiconductor chips 20a, 20b makes it possible for a radiation emitted by the semiconductor chips 20a, 20b to be mixed until leaving the conversion means 3.

In accordance with FIG. 1A, the two semiconductor chips 20a, 20b have an active zone 21, in which the radiation is generated during operation. The two semiconductor chips 20a, 20b therefore emit radiation having different wavelengths in the active regions 21.

The constituent parts of the semiconductor device 2 which are not essential for the description of the exemplary embodiment, such as electrical contact-connections, are not depicted in FIG. 1A and the further figures.

Figure 1B:
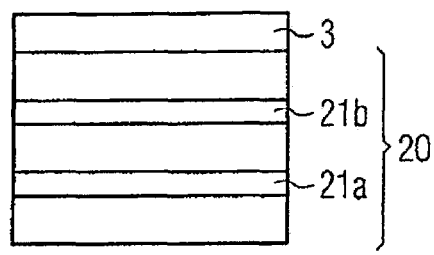

FIG. 1B illustrates a semiconductor chip 20. The semiconductor chip 20 comprises two active regions 21a, 21b. The active region 21a is configured for emitting radiation having the first wavelength L1 during the operation of the semiconductor chip 20. Radiation having the second wavelength L2 is generated in the active region 21b. A layer with the conversion means 3 is applied at a side of the semiconductor chip 20 which is remote from the active zone 21a. The semiconductor chip 20 therefore comprises two active zones 21a, 21b, which emit at different wavelengths L1, L2. Consequently, the semiconductor chip 20 emits at different wavelengths L1, L2 during operation.

Figure 1C:
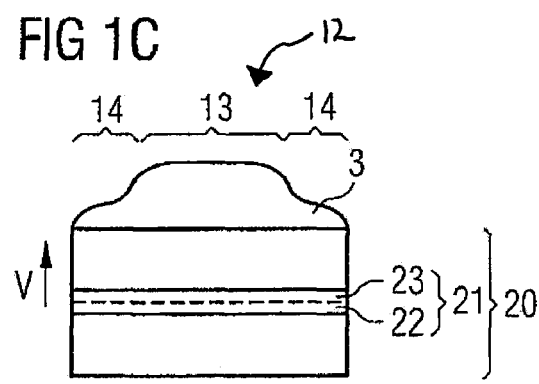

FIG. 1C illustrates a semiconductor chip 20 having a single active zone 21. With regard to the extent of the active zone 21 in a vertical direction V, a first part 22 is situated above a second part 23. The first part 22 comprises, for example, quantum wells configured differently than the part 23. The first part 22 and the second part 23 can, for example, each have three layers of quantum wells, wherein the layers extend substantially perpendicularly to the vertical direction V. First part 22 and second part 23 are not connected to one another by a tunnel junction. During operation, radiation having the first wavelength L1 is generated in the first part 22 of the active zone, and radiation having the second wavelength L2 is generated in the second part 23. First part 22 and second part 23 have different dopings, for example. In other words, the semiconductor chip 20 comprises only a single active zone, in which first wavelength L1 and second wavelength L2 are generated during operation.

At a main side 12 of the semiconductor chip 20, the conversion means 3 is applied as a layer. The layer comprising the conversion means 3 is structured. That is to say that, in a direction parallel to a main extension direction of the active zone 21, the thickness of the conversion means 3 is smaller in edge regions 14 than in a central region 13 above the first part 22 of the active zone 21.

Figure 1D:
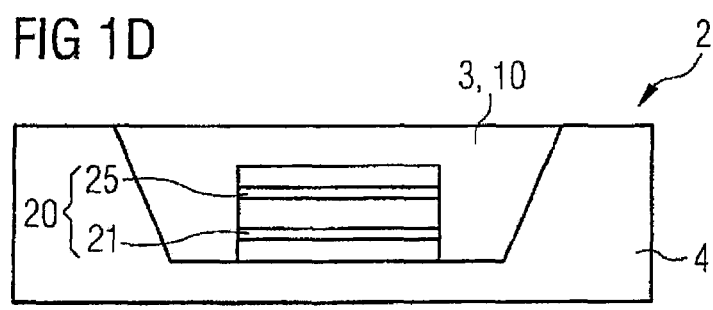

FIG. 1D depicts a semiconductor device 2 comprising a semiconductor chip 20 having an active zone 21 and a luminescents structure 25. During operation, radiation having the first wavelength L1 is generated in the active zone 21. This is partly converted into a radiation having the second wavelength L2 in the luminescents structure 25.

Radiation which leaves the semiconductor chip 20 passes to the conversion means 3, which is situated in the cutout 10. The cutout 10 is formed by the base body 4. The semiconductor chip 20 is likewise situated in the cutout 10.

The semiconductor devices 2 and semiconductor chips 20 illustrated in FIG. 1 can have structures (not depicted) for instance for electrical contact-connection or for improving the coupling-out of light. Likewise, the semiconductor device 2 can have reflection means, diffusion means and/or absorption means. These can be embodied as a coating and/or as admixtures.

An exemplary embodiment of a luminous means 1 is illustrated in FIG. 2. A semiconductor chip 20, for example in accordance with FIG. 1B or 1C, and a further semiconductor chip 24, which emits radiation during operation at a third wavelength in the red spectral range, are fitted on a carrier 7. The carrier 7 is formed with a ceramic, for example with aluminum oxide. The carrier 7 and also the semiconductor chips 20, 24 form the semiconductor device 2. The semiconductor device 2 is applied on a control unit 5. The power supply of the semiconductor device 2 is effected by means of the control unit 5. The power supply of the chips 20, 24 and the intensity ratio of the radiation emitted by the semiconductor chips 20, 24 can be set by means of the control unit 5. It is likewise possible for the radiation to be dimmable by means of the control unit 5.

The base body 4 surrounds the control unit 5 and the semiconductor device 2 in a ring- or box-shaped manner. In order to improve the mechanical connection between base body 4 and control unit 5, the control unit 5 has an undercut 11. A plate comprising the conversion means 3 is situated at that side of the base body 4 which is remote from the control unit 5. A covering plate 8 is applied at that side of the conversion means 3 which is remote from the semiconductor device 2. The covering plate 8 can be configured with a glass. The mechanical properties of the luminous means 1 can be improved by the covering plate 8.

The covering plate 8, in contrast to the illustration depicted, can likewise be shaped as an optical element, such as a lens or micro lens, and comprise at least one admixture for instance in the form of a filter means or scattering means.

FIGS. 3 and 4 illustrate the spectral properties of a luminous means 1, which, by way of example, can have at least one semiconductor device 2 or at least one semiconductor chip 20 in accordance with FIG. 1 or is constructed in accordance with FIG. 2, for instance.

Figure 3A:
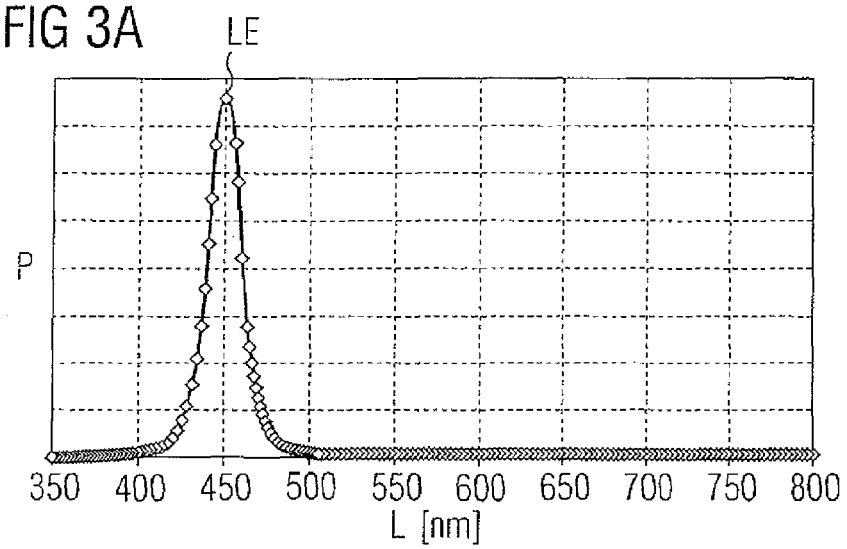
FIGS. 3 and 4 show schematic illustrations of the spectrum and chromaticity coordinate (C, F) of the radiation (A, D) emitted by a semiconductor device and also spectra of the radiation after passage through a conversion means (B, E) of exemplary embodiments of luminous means described here (D to F).
Figure 3B:
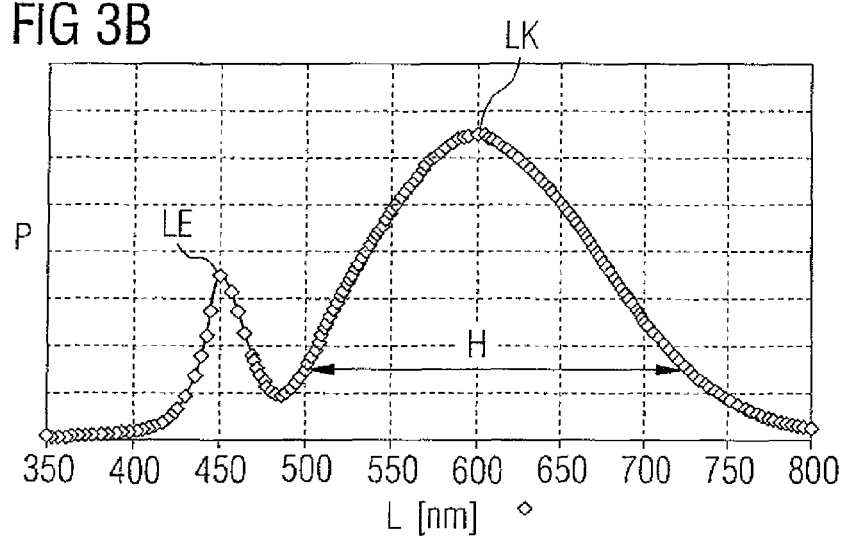
Figure 3C:
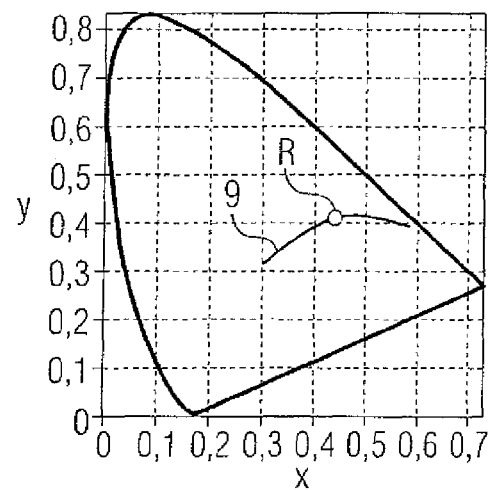

FIGS. 3A to 3C relate to a luminous means 1 having a semiconductor device 2 having only one emission wavelength LE. The emission wavelength LE, see FIG. 3A, is approximately 452 nm. In this case, the wavelength L in nanometers is plotted against the radiation power P, relative to wavelength intervals having a width of 2 nm.

FIG. 3B shows the resulting spectrum after conversion by the conversion means 3. A conversion wavelength LK is approximately 600 nm. A main operating range H of the conversion means 3, in which the radiation power P is at least 13.6% of the power P at the wavelength LK, extends from 500 nm to 730 nm. In FIGS. 3B, 3E, 4B, 4E, the main operating range H is in each case illustrated by means of a double-headed arrow line. On account of the conversion by the conversion means 3, the power P at the emission wavelength LE is reduced by approximately a factor of 20.

FIG. 3C illustrates an excerpt from the standard chromaticity diagram. The x-axis designates the red component, and the y-axis the green component of the radiation. The spectral signature illustrated in FIG. 3B corresponds to a chromaticity coordinate R of the light emitted by the luminous means 1 with the coordinates 0.43 and 0.41. The chromaticity coordinate R lies on the black body curve 9 in the standard chromaticity diagram. That is to say that the chromaticity coordinate R is metameric with respect to the radiation of a black body emitter. The color temperature corresponding to the temperature of a black body emitter whose chromaticity coordinate is closest to the chromaticity coordinate R of the luminous means 1 is approximately 3000 K. That is to say that the radiation emitted by the luminous means 1 has a color temperature of 3000 K. The color rendering index of the luminous means 1 is 80, and the efficiency is 69.5 lm/W.

FIG. 3D illustrates the radiation power P as a function of the wavelength L of the luminous means 1 comprising a semiconductor device 2, which emits light at the first wavelength L1 and the second wavelength L2 during operation. The first wavelength L1 is 444 nm, and the second wavelength L2 is 460 nm. The radiation power P at the first wavelength L1 is higher than at the second wavelength L2. Since the wavelengths L1, L2 are comparatively close together, an emission band of the wavelength L2 can be identified merely as a shoulder of an emission band of the wavelength L1. A spectral width B of the radiation emitted by the semiconductor device 2 during operation, symbolized by a double-headed arrow line, is approximately 55 nm.

FIG. 3E shows the emission spectrum of the luminous means 1 after the radiation emitted by the semiconductor device 2 has passed through the conversion means 3. The conversion wavelength LK is approximately 600 nm, and the main operating range H extends from approximately 500 nm to 730 nm. The conversion means 3 principally converts radiation having the first wavelength L1. This changes the power ratio of the radiation at the wavelengths L1, L2 with respect to one another. Therefore, the emission band of the second wavelength L2 is clearly discernible in FIG. 3E. The second wavelength L2 lies outside the main operating range H and is blue-shifted with respect thereto, FIG. 3F illustrates the excerpt from the standard chromaticity diagram. The chromaticity coordinate R lies on the black body curve 9, approximately at the same coordinates as in the case of the luminous means 1 in accordance with FIGS. 3A to 3C. The luminous means 1 emits warm-white light. The color rendering index is likewise 80, and the color temperature is 3000 K. However, the efficiency has increased significantly to 74.3 lm/W.

The increase in efficiency of the luminous means 1 in accordance with FIGS. 3D to 3F in conjunction with the same chromaticity coordinate R and at least the same color rendering index as in FIGS. 3A to 3C is based, inter alia, on the following insight:

The semiconductor device 2 comprises semiconductor chips 20 based, for example, on the material system GaN or InGaN. On account of the material properties of GaN or InGaN, the highest efficiency of an optoelectronic semiconductor chip based on such a material can be obtained in the spectral range between approximately 400 nm and 440 nm. That is to say that, in order to achieve a high efficiency, the emission wavelength LE or the first wavelength L1 preferably lies in the spectral range between 420 nm and 440 nm. In the blue spectral range, the human eye has the highest sensitivity at approximately 460 nm. In order to obtain a high color rendering index, therefore, it is desirable to operate the semiconductor device 2 or a semiconductor chip 20 at wavelengths around 460 nm. In other words, an optimum spectral range with regard to the efficiency is around approximately 430 nm, and an optimum spectral range with regard to the color rendering quality is at approximately 460 nm.

Since the FWHM width of an emission band of a semiconductor chip is of the order of magnitude of between 20 nm and 30 nm, an optimization with regard to efficiency and color rendering quality can be obtained only with difficulty with a single emission wavelength LE. By using a first wavelength L1 and a second wavelength L2, therefore, it is possible to increase firstly the efficiency of the luminous means 1 and secondly the color rendering quality.

Figure 4A:
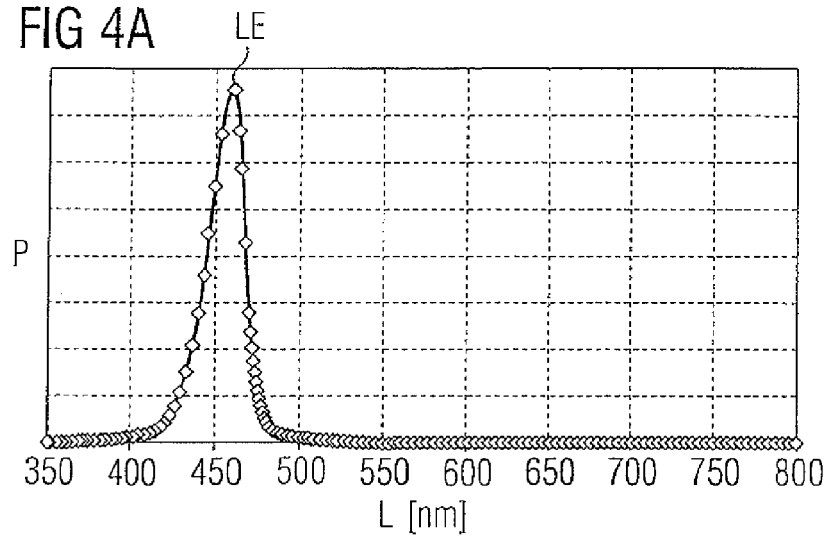
Figure 4B:
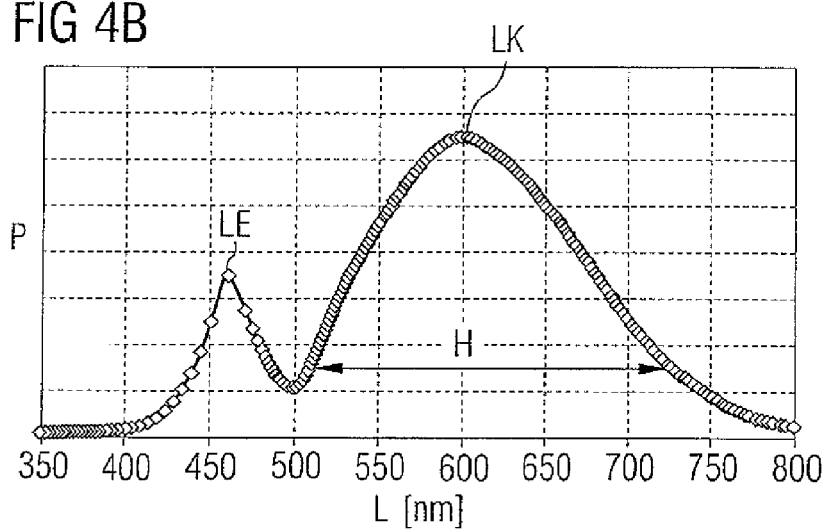
Figure 4C:
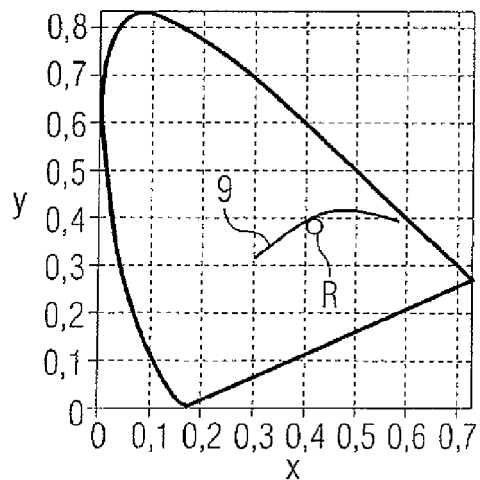

FIG. 4A illustrates the radiation power P against the wavelength L of a semiconductor chip having an emission wavelength LE of 460 nm, and the spectrum obtained on account of the conversion means 3 with the main operating range H from 500 nm to 730 nm and the conversion wavelength KL of 600 nm is shown in FIG. 4B. The corresponding excerpt from the standard chromaticity diagram is depicted in FIG. 4C. The chromaticity coordinate R does not lie on the black body curve 9. The radiation emitted by the luminous means 1 appears reddish, rather than white, to the human eye. The color rendering index is 88, and the color temperature is approximately 3000 K.

Figure 4D:
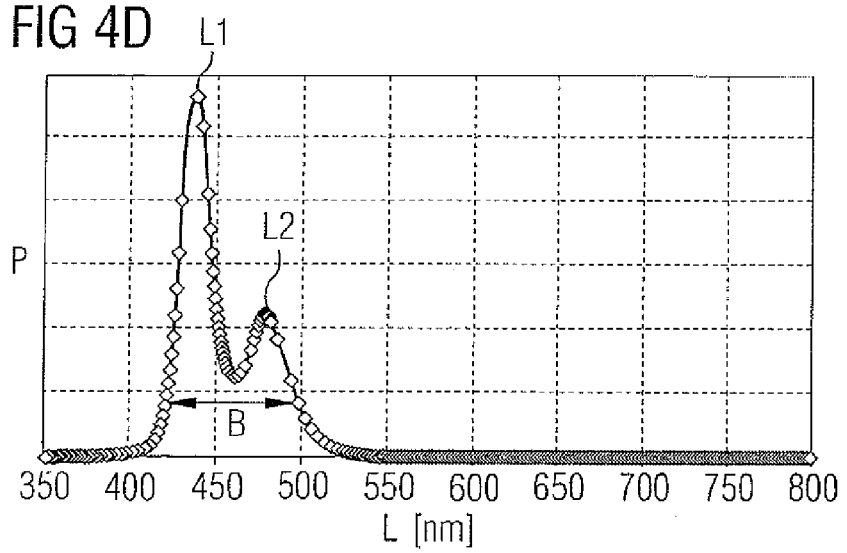
Figure 4E:
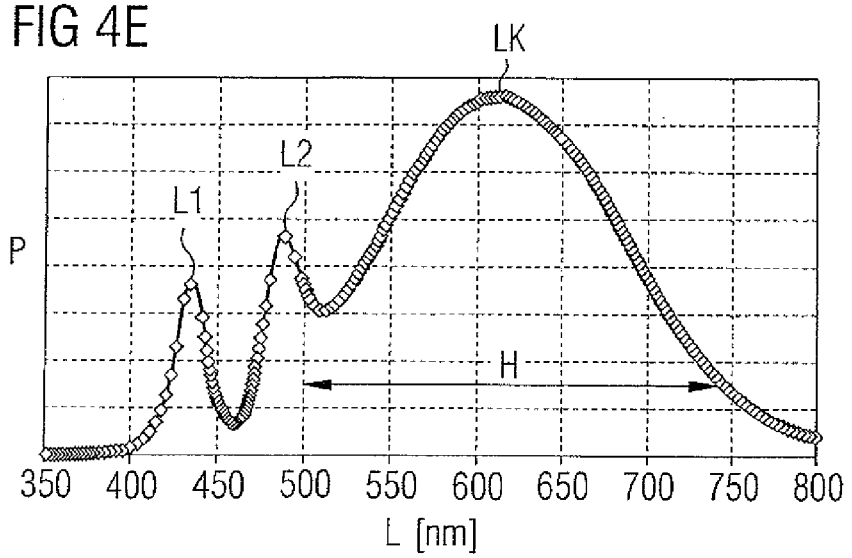
Figure 4F:
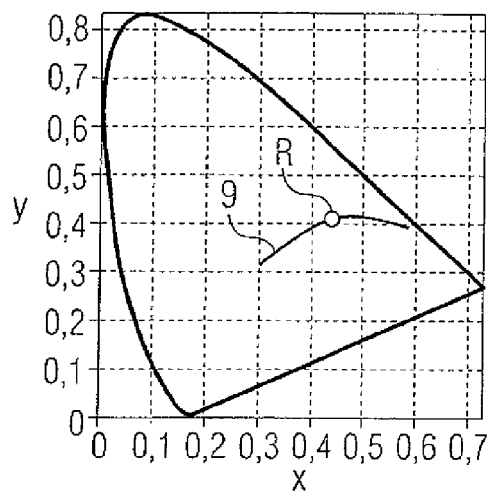

A semiconductor device 2 having a first wavelength L1 of 438 nm and a second wavelength L2 of 480 nm is illustrated in FIG. 4D. The spectral width B is approximately 80 nm. The color rendering index of the light emitted by the luminous means 1, see FIGS. 3E and 3F, is 90, and the efficiency is 60.5 lm/W. The chromaticity coordinate R lies on the black body curve 9. The main operating range H of the conversion means 3 having a conversion wavelength of 600 nm extends from 500 nm to 730 nm. The second wavelength L2 is blue-shifted, that is to say at a higher frequency, with respect to the main operating range H.

Principally the first wavelength L1 is converted into a radiation having the conversion wavelength LK by the conversion means 3. In the case of the converted light, the second wavelength L2 is significantly more intensive than the first wavelength L1, in comparison with the radiation emitted directly by the semiconductor device 2 in accordance with FIG. 4D.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A luminous means, comprising:
    at least one optoelectronic semiconductor device which emits electromagnetic radiation during operation at at least one first wavelength and at at least one second wavelength, the first wavelength is around 430 nm and the second wavelength is around 470 nm, with a tolerance of 10 nm in each case; and
    at least one conversion means which converts the first wavelength at least partly into radiation having a different frequency,
    wherein a radiation spectrum emitted by the luminous means during operation is metameric with respect to a black body spectrum,
    wherein the second wavelength is at smaller wavelengths than a main operating range of the conversion means, and
    wherein the conversion means converts a proportion of at least 50% of the first wavelength into a radiation having a different wavelength, said proportion being at least 5 percent greater than a corresponding proportion of the second wavelength.

2. The luminous means according to claim 1, wherein the semiconductor device comprises at least one semiconductor chip which emits at the first wavelength and at least one semiconductor chip which emits at the second wavelength.

3. The luminous means according to claim 1, wherein the semiconductor device comprises at least one semiconductor chip which comprises at least two active regions, and wherein at least a first one of the active regions is designed to emit radiation having the first wavelength during operation, and wherein at least a second one of the active regions is designed to emit radiation having the second wavelength during operation.

4. The luminous means according to claim 1, wherein the semiconductor device has at least one semiconductor chip having an active zone having a first part and a second part, wherein, during operation, the first part emits radiation having the first wavelength and the second part emits radiation having the second wavelength.

5. The luminous means according to claim 1, wherein the first wavelength and the second wavelength are spectrally separated from one another by at least 20 nm.

6. The luminous means according to claim 1, wherein a spectral width of the radiation emitted by the semiconductor device is at least 50 nm.

7. The luminous means according to claim 1, the color rendering index $R_a$ of which is at least 80.

8. The luminous means according to claim 1, the efficiency of which is at least 60 lm/W.

9. The luminous means according to claim 1, the color temperature of which lies between 2500 K and 6500 K inclusive.

10. The luminous means according to claim 1, wherein the semiconductor device comprises at least one semiconductor chip which emits light having a third wavelength of at least 600 nm during operation.

11. The luminous means according to claim 1, further comprising a control unit adapted to set the intensity ratio between the first wavelength and the second wavelength.

12. The luminous means according to claim 1, wherein the conversion means comprises a phosphor A with the common formula $(Y,Gd,Lu)_3(Al,Ga)_5O_{12}:Ce^{3+}$, wherein said phosphor A has an emission maximum in the spectral range between 550 nm and 575 nm.

13. The luminous means according to claim 12, wherein the conversion means comprises a phosphor B with the common formula $(Ca,Sr,Ba)AlSiN_3:Eu^{2+}$ or the common formula $(Ca,Sr,Ba)_2Si_5N_8:Eu^{2+}$, and wherein said phosphor B has an emission maximum in the spectral range between 595 nm and 610 nm.

14. The luminous means according to claim 13, wherein an absorption maximum of the phosphor A is between 420 nm and 480 nm, and wherein the phosphor B has a monotonously increasing absorption in a direction to shorter wavelengths.

15. The luminous means according to claim 1, wherein at least 75% of the radiation of the second wavelength is transmitted through the conversion means, and wherein at least 95% of the light of the first wavelength is converted by the conversion means.

16. The luminous means according to claim 11, wherein the control unit is configured to adjust a color temperature of the radiation emitted by the luminous means.

* * * * *